(12) United States Patent
Endo et al.

(10) Patent No.: US 8,486,821 B1
(45) Date of Patent: Jul. 16, 2013

(54) METHOD AND APPARATUS FOR VARIABLE CONDUCTANCE

(75) Inventors: Rick Endo, San Carlos, CA (US); Jay Dedontney, San Jose, CA (US); James Tsung, Milpitas, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/489,312

(22) Filed: Jun. 5, 2012

(51) Int. Cl.
*H01L 21/44* (2006.01)

(52) U.S. Cl.
USPC .................................. 438/597; 257/E21.158

(58) Field of Classification Search
None
See application file for complete search history.

(56) References Cited

U.S. PATENT DOCUMENTS

| 7,981,262 B2 * | 7/2011 | Pavloff et al. ............ 204/298.11 |
| 8,216,376 B1 * | 7/2012 | Endo et al. ..................... 118/715 |

* cited by examiner

*Primary Examiner* — Seahvosh Nikmanesh

(57) ABSTRACT

A method of combinatorially processing a substrate and combinatorial processing chamber are provided. The processing chamber includes opposing annular rings defining a conductance gap that extends radially outward. The opposing annular rings are configured to vary the conductance gap in-situ. The variation of the conductance gap is another parameter for processing regions of a substrate differently to evaluate the impact of the conductance variation on a deposition process.

5 Claims, 7 Drawing Sheets

METHOD AND APPARATUS FOR VARIABLE CONDUCTANCE

BACKGROUND OF THE INVENTION

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate. Equipment for performing the combinatorial processing must support the efficiency offered through the combinatorial processing operations.

It is within this context that the invention arises.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
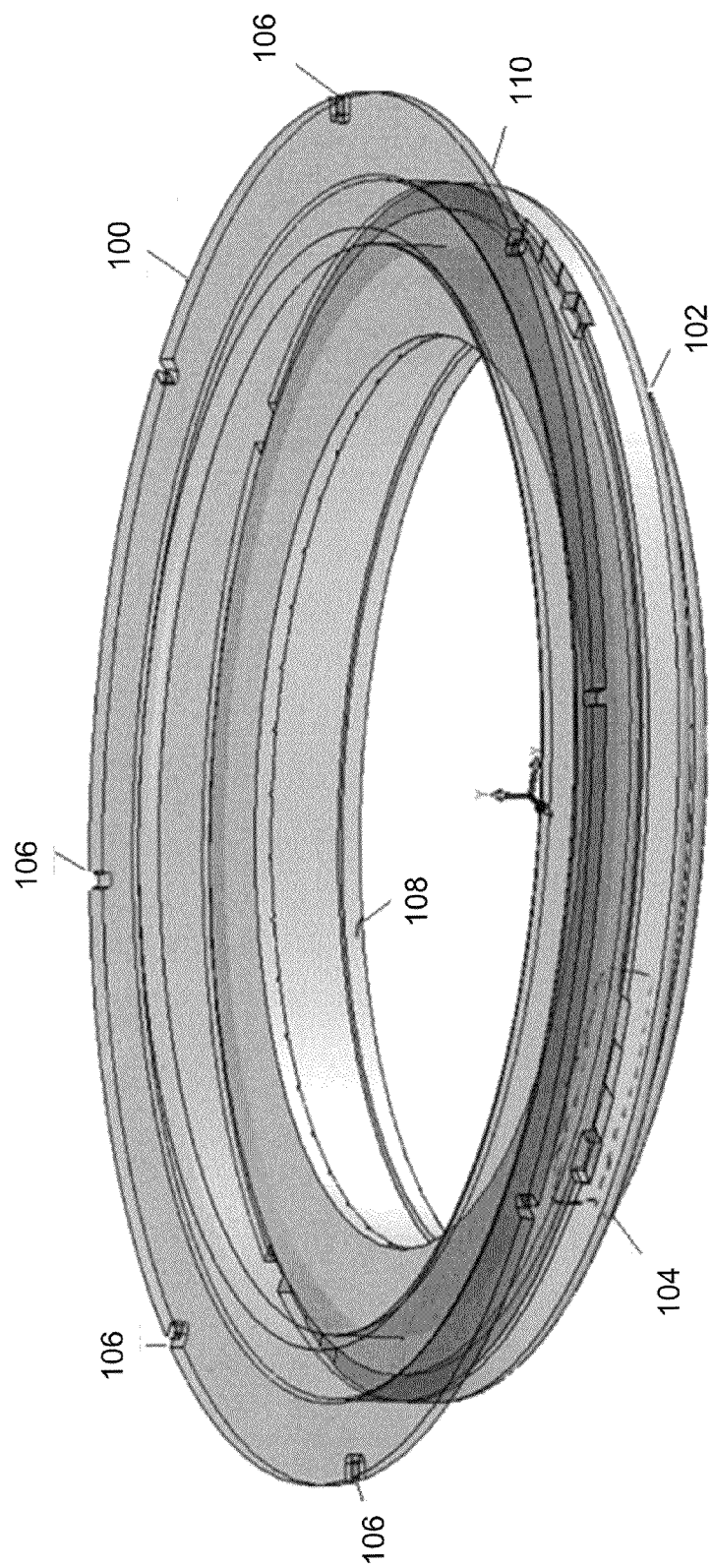
FIG. 1 is a simplified perspective view of the variable conductance ring configuration for a semiconductor processing chamber in accordance with one embodiment of the invention.

An invention is described for a system, apparatus and method for varying the conductance in-situ in a semiconductor processing chamber. It will be obvious, however, to one skilled in the art, that the present invention may be practiced without some or all of these specific details. In other instances, well known process operations have not been described in detail in order not to unnecessarily obscure the present invention.

The embodiments described below provide details for a multi-region processing system and associated showerhead that enable processing a substrate in a combinatorial fashion. Thus, different regions of the substrate may have different properties, which may be due to variations of the materials, unit processes (e.g., processing conditions or parameters) and process sequences, etc. For some embodiments, within each region the conditions are preferably substantially uniform so as to mimic conventional full wafer processing within each region. However, useful results can be obtained for certain experiments without this requirement. In one embodiment, the different regions are isolated so that there is no interdiffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial processing and return the substrate to the manufacturing process flow for further processing. Alternatively, the substrate can be processed in an integrated tool that allows both combinatorial and conventional processing in various chambers attached around a central chamber or within a R&D facility such as a clean room. Consequently, in one substrate, information concerning the varied processes and the interaction of the varied processes with conventional processes can be evaluated. Accordingly, a multitude of data is available from a single substrate for a desired process.

The embodiments described herein also enable the application of combinatorial techniques for process sequence integration of semiconductor manufacturing operations. Combinatorial processing applied to semiconductor manufacturing operations assists in arriving at a globally optimal sequence of semiconductor manufacturing operations by considering interaction effects between the unit manufacturing operations, the process sequence of the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated (e.g., 'site-isolated') so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequences used to build that portion of the device or structure. According to some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips.

In some embodiments, while the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters or conditions, such as a voltage, flow rate, etc., may be varied between regions, as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity. In essence, the combinatorial processing performs semiconductor manufacturing operations on multiple regions of a substrate so that the multiple regions are processed differently to achieve different results.

Atomic layer deposition (ALD) processes can require a heated pedestal having a temperature that ranges between room temperature and 500 degrees C. In one embodiment, the pedestal temperature ranges from 150 to 350 degrees C. during processing. The pumped area conductance for the process cavity around the pedestal perimeter is critical for determining the flow streams of the process gas at various flow rates and process pressures. Depending on how the perimeter is designed, the conductance may be significantly affected with thermal expansion of the pedestal chuck and the pumping path.

The embodiments described herein provide for a design which allows in-situ varying of the pumping conductance, as well as minimizing the effects of thermal expansion on the conductance. In the embodiments, the pumping area from the process cavity is defined radially out horizontally along the pedestal surface. The horizontal gap eliminates or minimizes the impact of thermal expansion as the pedestal expands outward and not vertically. In one embodiment, the vertical gap defined between the sidewall of the chamber and the outer surface of the bottom annular ring is between about 10 to about 20 mm, while the horizontal gap between the two annular rings is adjustable in a range between about 0 to about 8 mm. Thus, the conductance is decoupled from the vertical circumference gap and the horizontal gap controls. The embodiments described herein take advantage of this configuration to enable adjustment of the conductance in-situ to provide for further variables to manipulate for the combinatorial processing on a single substrate. In one embodiment, the conductance may be varied through selected mating positions of opposing annular rings. In this embodiment, one of the annular rings includes a staircase configuration of variably elevated surfaces and the other ring includes an extension that is configured to rest on one of the variably elevated surfaces. Through the movement of one of the annular rings, the extension can mate with different ones of the variably elevated surfaces in order to adjust the conductance gap. In one embodiment, the conductance gap may be substantially shut down. In this embodiment, where a low vapor pressure precursor is used, e.g., some solid source, it is possible to close off the conductance path in the embodiments below to allow the process cavity to be "charged up." The conductance path can then be opened for a subsequent streamline flow for a deposition process without breaking vacuum. It should be appreciated that the embodiments enable the conductance gap to be varied and are analogous to having an extra knob on the processing chamber for variably adjusting the conductance gap during the processing.

FIG. 1 is a simplified perspective view of the variable conductance ring configuration for a semiconductor processing chamber in accordance with one embodiment of the invention. The variable conductance ring of FIG. 1 includes a top annular ring 100 disposed over a bottom annular ring 102. Top annular ring 100 includes a plurality of notches 106, which may be referred to as indentations, on an outer-periphery of an outer extension 110 of the top annular ring. The outer extension 110, which may also be referred to as a collar, can be used to define a stop point during the vertical movement of top annular ring 100. For example, a bottom surface of outer extension 110 can rest on a support surface along the inner chamber walls in accordance with one embodiment of the invention.

Notches 106 of FIG. 1 may be used to mate with guide pins defined vertically along an inner surface of the chamber sidewalls in order to hold or prevent top annular ring 100 from rotating. In one embodiment, the notches allow for pins in the chamber to match up with the notches to ensure clocking accuracy of the top ring relative to the chamber showerhead as the wafer shifts azimuth location relative to the showerhead. In alternative embodiment, the upper or top annular ring 100 shifts azimuth location relative to the showerhead and the pedestal position azimuth is fixed. The notches in this alternative embodiment can be used for visually inspecting that the upper ring position has changed to the proper azimuth location. For example, a sensing device such as a through beam laser detector with an emitter and receiver may be integrated into the chamber to achieve the visual inspection. In one embodiment, the beam is received through the notch to a charge-coupled device (CCD) in order to provide feedback on the rotational location of the upper ring for proper processing. Thus, top annular ring 100 moves in one dimension, i.e., vertically, in one embodiment. Bottom annular ring 102 is configured to mate with top annular ring 100. Bottom annular ring 102 includes an inner region which has been beveled and is configured to be placed over a pedestal or substrate support within the semiconductor processing chamber. Within region 104 is a series of elevated surfaces disposed on a top surface of bottom annular ring 102. An extension from the bottom surface of top annular ring 100 mates with the series of elevated surfaces in order to define a variable conductance gap that may be used for combinatorial processing as described further below.

Figure 2:
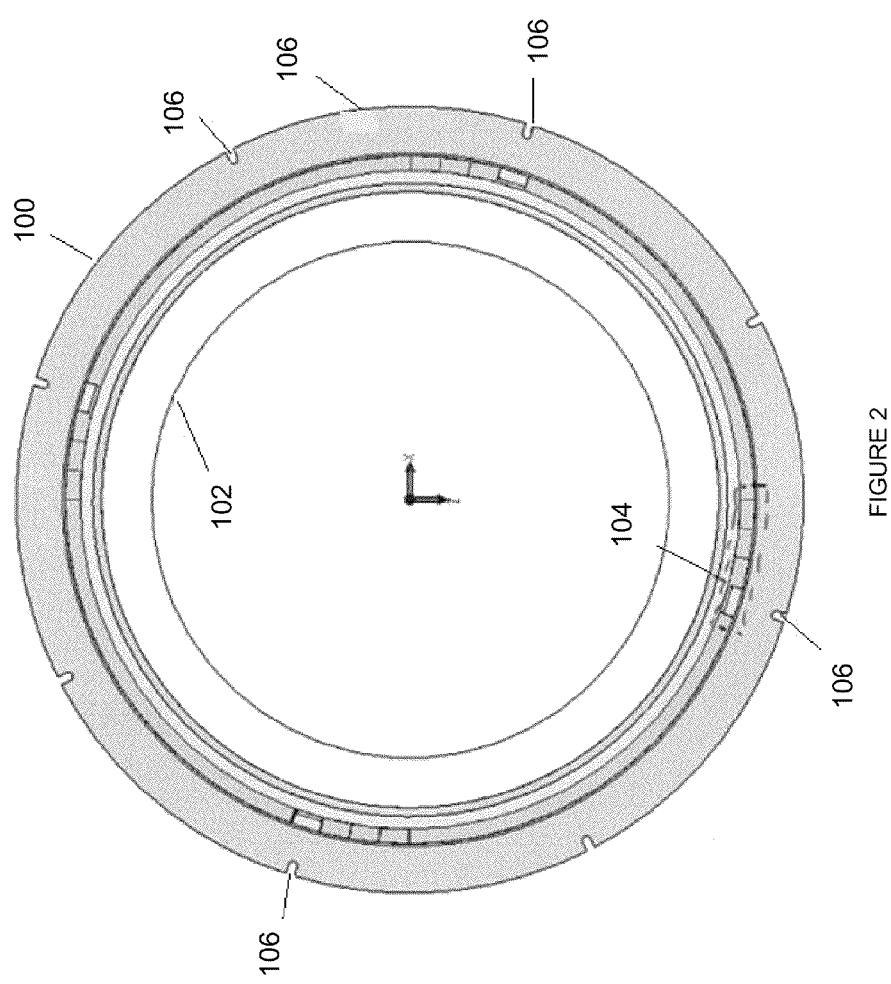
FIG. 2 is a top view of the variable conductance ring in accordance with one embodiment of the invention.

FIG. 2 is a top view of the variable conductance ring in accordance with one embodiment of the invention. Top annular ring 100 is disposed over bottom annular ring 102. It should be appreciated that top annular ring 100 is supported from a support surface defined circumferentially along the sidewall of the processing chamber in an embodiment, e.g., when not in contact with bottom annular ring 102. Bottom annular ring 102 is disposed over a pedestal within the processing chamber. A plurality of notches 106 disposed on an outer extension 110 of top annular ring 100 are used to maintain a spatial relationship of top annular ring 100 with bottom annular ring 102.

That is, notches 106 prevent top annular ring 100 from rotating in one embodiment. However, it should be appreciated that in alternative embodiments, top annular ring 100 may be free to rotate along with or separately from bottom annular ring 102. Within region 104, an extension from top annular ring 100 mates with a corresponding elevated surface of bottom annular ring 102 in order to define different conductance gaps for the combinatorial processing.

Still referring to FIG. 2, it should be appreciated that bottom annular ring 102 is disposed over a pedestal of the semiconductor processing chamber and as the pedestal rotates and moves vertically, the bottom annular ring rotates and moves vertically. As top annular ring 100 is free to move vertically when mating with bottom annular ring 102, the rotation of the bottom annular ring enables the extension from the top annular ring to mate with the variable elevated surfaces. Thus, a conductance gap between the top and bottom annular rings can be varied in this configuration. In addition, the pathway for the conductance gap is a horizontal pathway, i.e., extends radially outward, without the vertical constraints of a vertically defined pathway, which may vary with temperature much more than the horizontal pathway. Thus, the conductance for a vertical pathway is impacted through temperature changes much more than with the horizontal pathway of the embodiments described herein.

Figure 3:
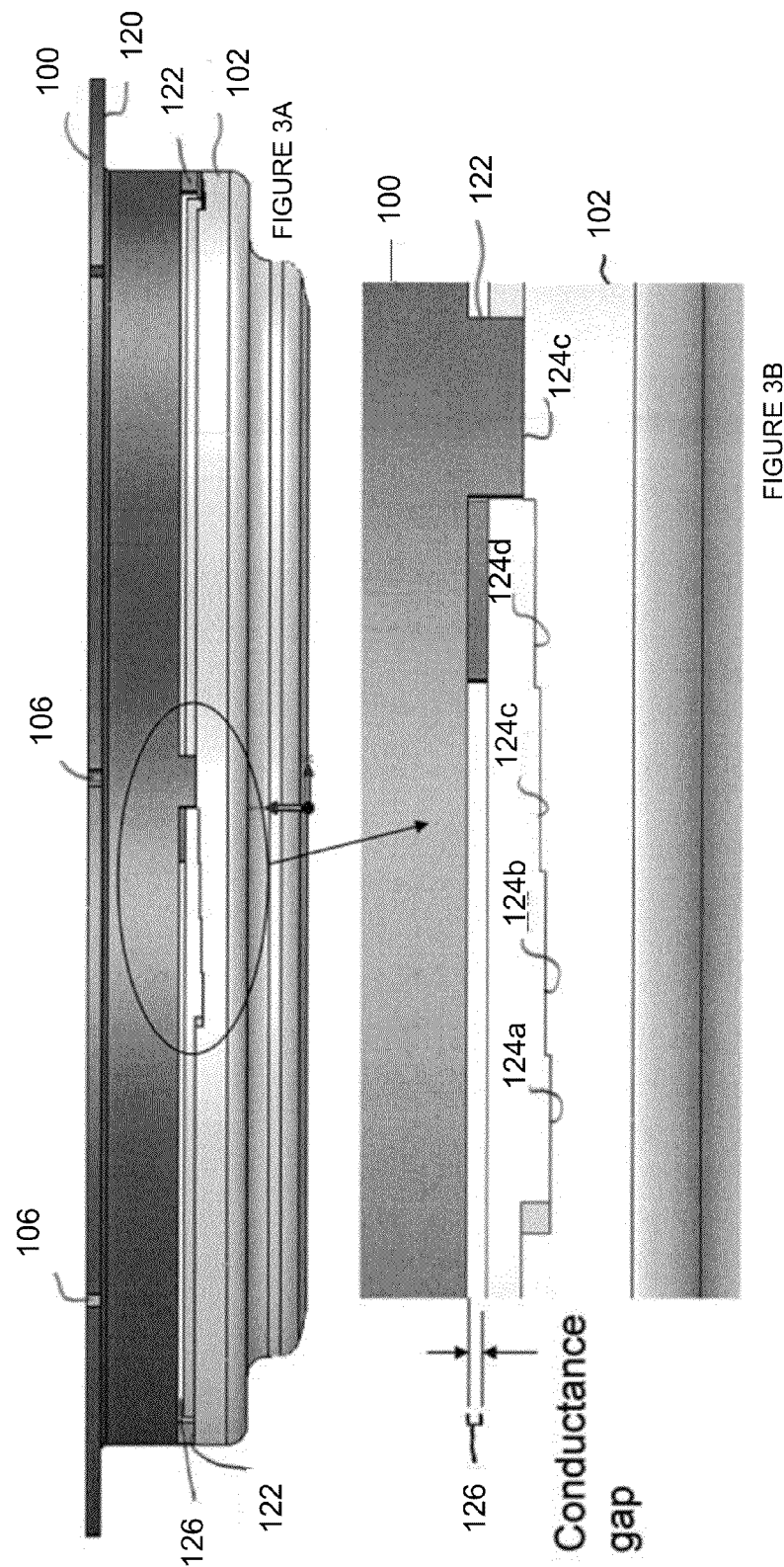
FIG. 3A is a side view of the top annular ring disposed over the bottom annular ring in accordance with one embodiment of the invention.
FIG. 3B is a more detailed diagram of the variably elevated surface of FIG. 3A.

FIG. 3A is a side view of the top annular ring disposed over the bottom annular ring in accordance with one embodiment of the invention. Top annular ring 100 is disposed over bottom annular ring 102. Top annular ring 100 may be supported by a support within the processing chamber that contacts surface 120 of the collar around outer peripheral top portion of the top annular ring. Extensions 122 on a bottom surface of top annular ring 100 are configured to mate with variably elevated surfaces disposed along a circumference of bottom annular ring 102. Depending on which level of the variably elevated surfaces that extensions 122 mate with, a certain gap 126 is defined for the conductance.

FIG. 3B is a more detailed diagram of region 104 of FIG. 3A. In FIG. 3B, elevated surfaces 124a through 124e define a staircase structure that may be disposed on numerous regions of a top surface of bottom annular ring 102. One skilled in the art will appreciate that extension 122 will be configured to mate with corresponding elevated surfaces along the top surface of bottom annular ring 102. Thus, a consistent horizontal gap 126 that extends radially outward is provided along the interface between top annular ring 100 and bottom annular ring 102. In one embodiment, there are four regions 104 defined on a top surface of bottom annular ring 102 and four extensions 122 defined on a bottom surface of top annular ring 100. The regions and extensions may be placed at about 90 degree intervals. However, this configuration is exemplary and there may be any suitable number of regions 104 and corresponding extensions 122 that will provide support and stability for the mating of the top and bottom annular rings. In one embodiment, gap 126 may vary from essentially zero to about 8 mm. It should be appreciated that this range of variation is exemplary and more variation is possible based on the application.

Figure 4:
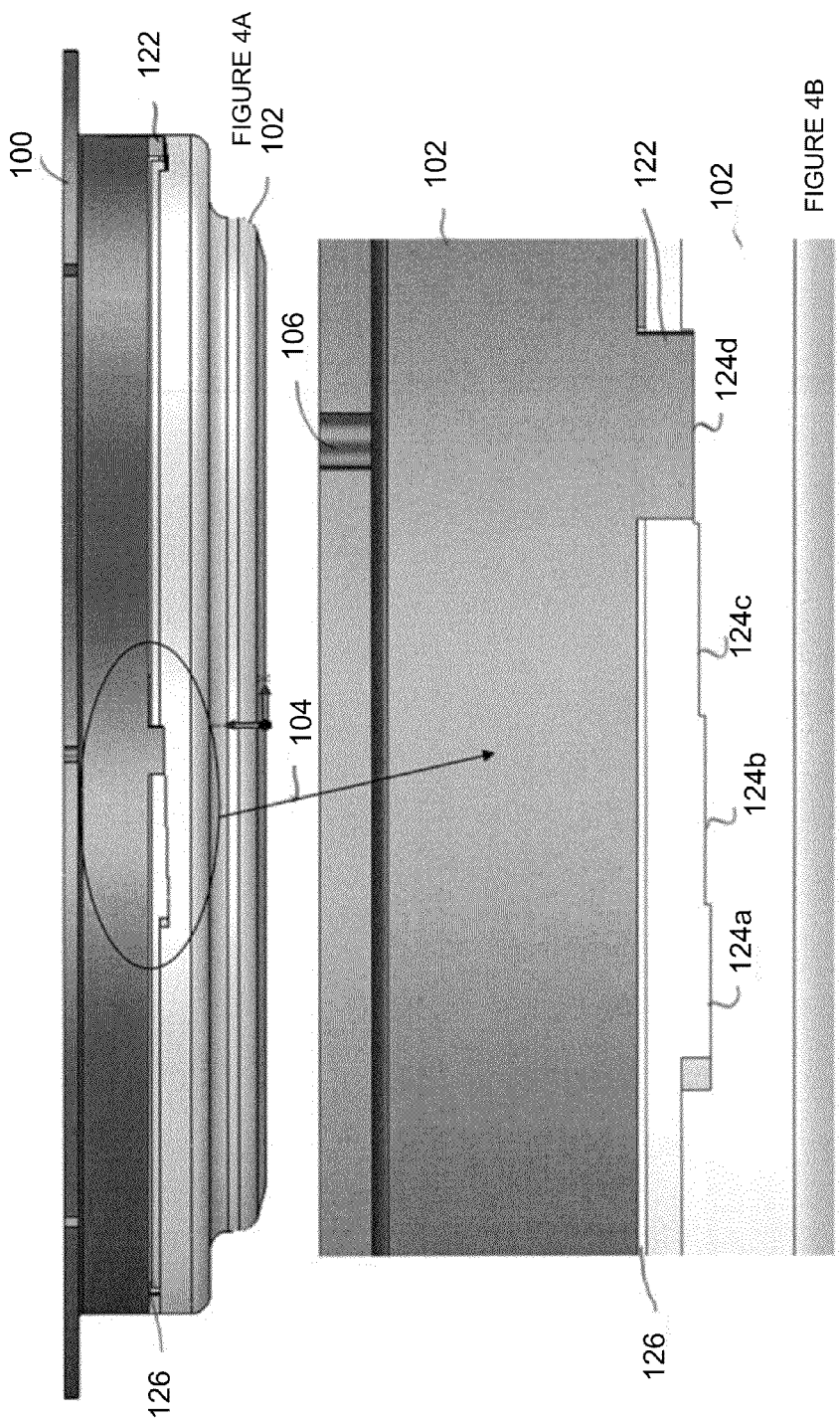
FIGS. 4A and 4B illustrate an alternative embodiment of FIGS. 3A and 3B where the bottom annular ring has been rotated to define a different conductance gap in accordance with one embodiment of the invention.

FIGS. 4A and 4B illustrate an alternative embodiment of FIGS. 3A and 3B where the bottom annular ring has been rotated to define a different conductance gap in accordance with one embodiment of the invention. In FIG. 4A, top annular ring 100 is disposed over bottom annular ring 102. Extensions 122 mate with a different variably elevated surface of the staircase on lower annular ring 102 as compared to the embodiment in FIG. 3A. As a result of this difference, gap 126 of FIGS. 4A and 4B varies from gap 126 of FIGS. 3A and 3B in this embodiment. It should be appreciated that the bottom annular ring 102 may move vertically as a pedestal which supports bottom annular ring 102 moves vertically. When dropping or lowering bottom annular ring 102, a stop that supports top annular ring 100 enables the bottom annular ring 102 to disengage from the top annular ring. Once the rings are disengaged the pedestal can rotate, which in turn rotates bottom annular ring 102, in order for extensions 122 to be aligned with different elevated surfaces of the staircase configuration.

In FIG. 4B a more detailed illustration of the mating of top annular ring 100 and bottom annular ring 102 is provided. As compared to FIG. 3B, extension 122 is aligned and supported on elevated surface 124d, instead of elevated surface 124e of FIG. 3B. As mentioned above, the disengagement of top annular ring 100 and bottom annular ring 102 and the subsequent rotation of the pedestal with the bottom annular ring disposed thereon enables alignment of any of the elevated surfaces 124a through 124e with the support extension 122 of the top annular ring. As a result of the lower surface utilized in the embodiment of FIG. 4B, gap 126 is smaller relative to the gap in FIG. 3B. Accordingly, the conductance can be varied without the need to break vacuum in the combinatorial processing chamber so that different regions of a substrate may be processed using different conductances when performing the combinatorial processing.

Figure 5:
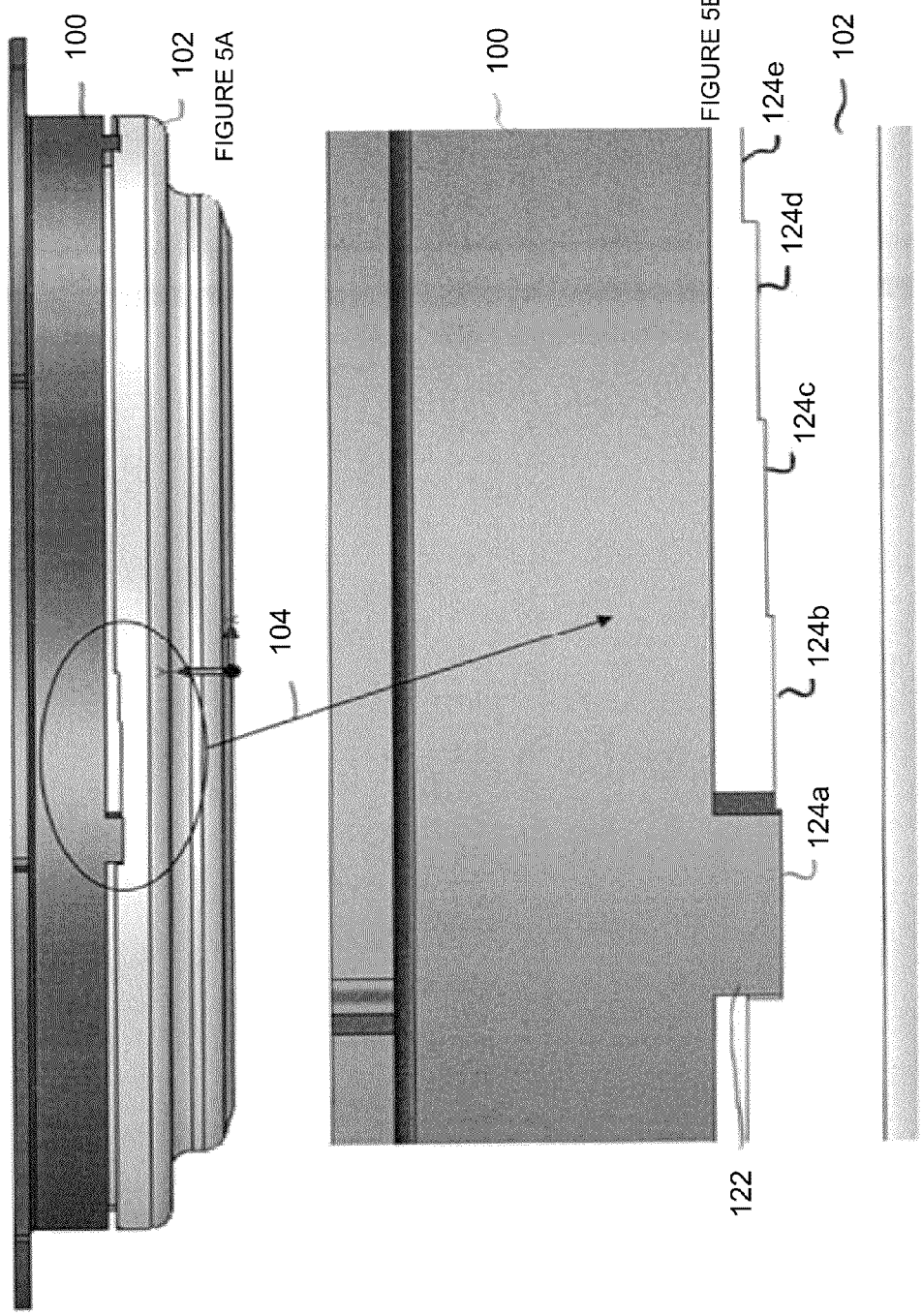
FIGS. 5A and 5B illustrate an embodiment where no conductance is allowed between the top annular ring and the bottom annular ring in accordance with one embodiment of the invention.

FIGS. 5A and 5B illustrate an embodiment where the conductance is substantially shut down between the top annular ring and the bottom annular ring in accordance with one embodiment of the invention. In FIG. 5A, support extension 104 is dropped to a lowest elevated surface which enables the gap to be closed off between top annular ring 100 and bottom annular ring 102. As illustrated in FIG. 5B, top annular ring 100, i.e., extension 122, mates with surface 124a of bottom ring 102. At this level, a bottom surface of top annular ring 100 will contact a top surface of bottom annular ring 102 to close the conductance gap. One skilled in the art will appreciate that the embodiments described herein are exemplary and not meant to be limiting. For example, while the staircase configuration illustrated herein may allow for a small gap to exist within region 104 even when the extension is placed on the lowest elevated surface, alternative configurations are possible to further reduce the gap in this area. In one embodiment, an opposing staircase configuration can be disposed on a bottom surface of the top annular ring in order to eliminate the gap in this area. In alternate embodiments, two slanted angled surfaces or sawtoothed slanted angle mating surfaces, etc., may be provided as the surfaces are not restricted to flat steps.

Figure 6:
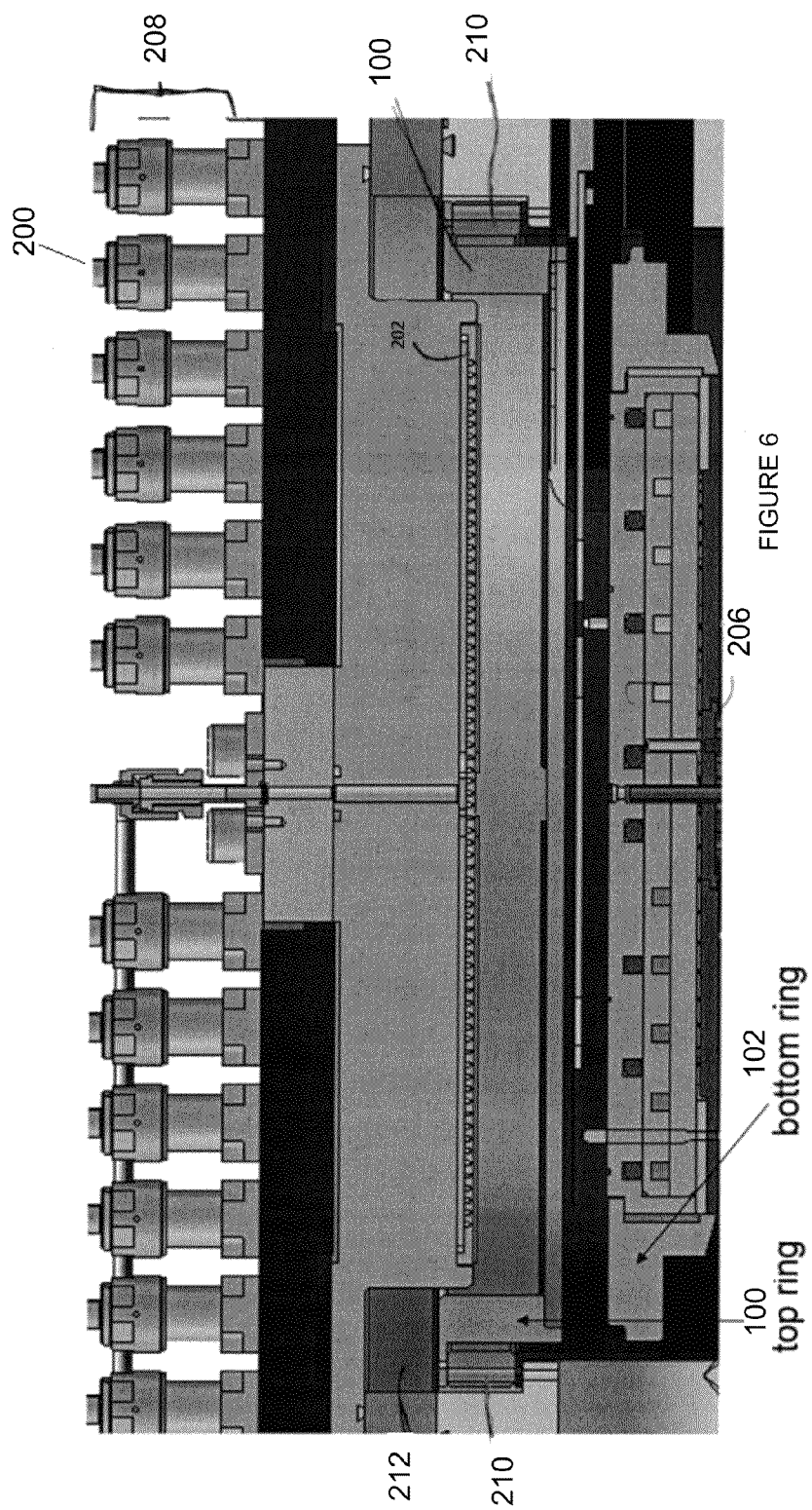
FIG. 6 is a simplified schematic diagram illustrating a semiconductor processing chamber having the annular rings for providing a variable conductance gap in accordance with one embodiment of the invention.

FIG. 6 is a simplified schematic diagram illustrating a semiconductor processing chamber having the annular rings for providing a variable conductance gap in accordance with one embodiment of the invention. Process chamber 200 includes showerhead 202, top ring 100, bottom annular ring 102, pedestal 206, and process gas/fluid supplies 208. It should be appreciated by one skilled in the art that additional features known in the art for ALD processing chambers may be included in process chamber 200. These known features are not discussed in detail in order not to obscure embodiments of the invention. In on embodiment showerhead 202 is a dual path showerhead as disclosed in U.S. application Ser. No. 12/346,195. The embodiments described herein may include any suitable showerhead for semiconductor processing and are not limited to a particular showerhead. Top annular ring 100 is supported by support extension 210 in a lowest position for the top annular ring. Region 212 is a cavity that enables the top annular ring to move vertically therethrough as needed. In one embodiment, pedestal 206, on which bottom annular ring 102 rests, lowers so that bottom annular ring 102 disengages from top annular ring 100. Once the two annular rings are disengaged, pedestal 206 can rotate so that the extensions from the top annular ring will mate with a different elevated surface of the bottom annular ring. Accordingly, the top annular ring and bottom annular ring configuration described herein may be used to vary the conductance gap in order to run combinatorial experiments within the processing chamber. It should be appreciated that the pumping area from the process cavity is radially out, i.e., horizontal to the pedestal surface. Consequently, conductance is controlled through the spacing between bottom annular ring 100 and top annular ring 102.

In one embodiment, top annular ring 100 has supports on the underside of the annular ring and the bottom annular ring 102 has mating areas, which can be configured in a staircase configuration as described above. When top annular ring 100 is at a highest level of the staircase, the radial conductance gap will be at its maximum value. Likewise, when the extension of the top annular ring rests on a lowest level of the staircase, the radial conductance will be substantially closed off. It should be appreciated that the conductance provided through the conductance gap extends radially out and is defined between horizontal surfaces of the bottom and top annular rings. Accordingly, the gap between the peripheral edge of the substrate support and the sidewall of the chamber, which is defined between vertical surfaces and is effected by thermal expansion, is not controlling in these embodiments. One skilled in the art will appreciate that modifications to the embodiments described herein are possible to achieve the desired results. For example, more or less than four posts may be utilized, or the horizontal conductance area may be defined in board of the posts and the staircase area to further minimize any impact of the posts.

Figure 7:
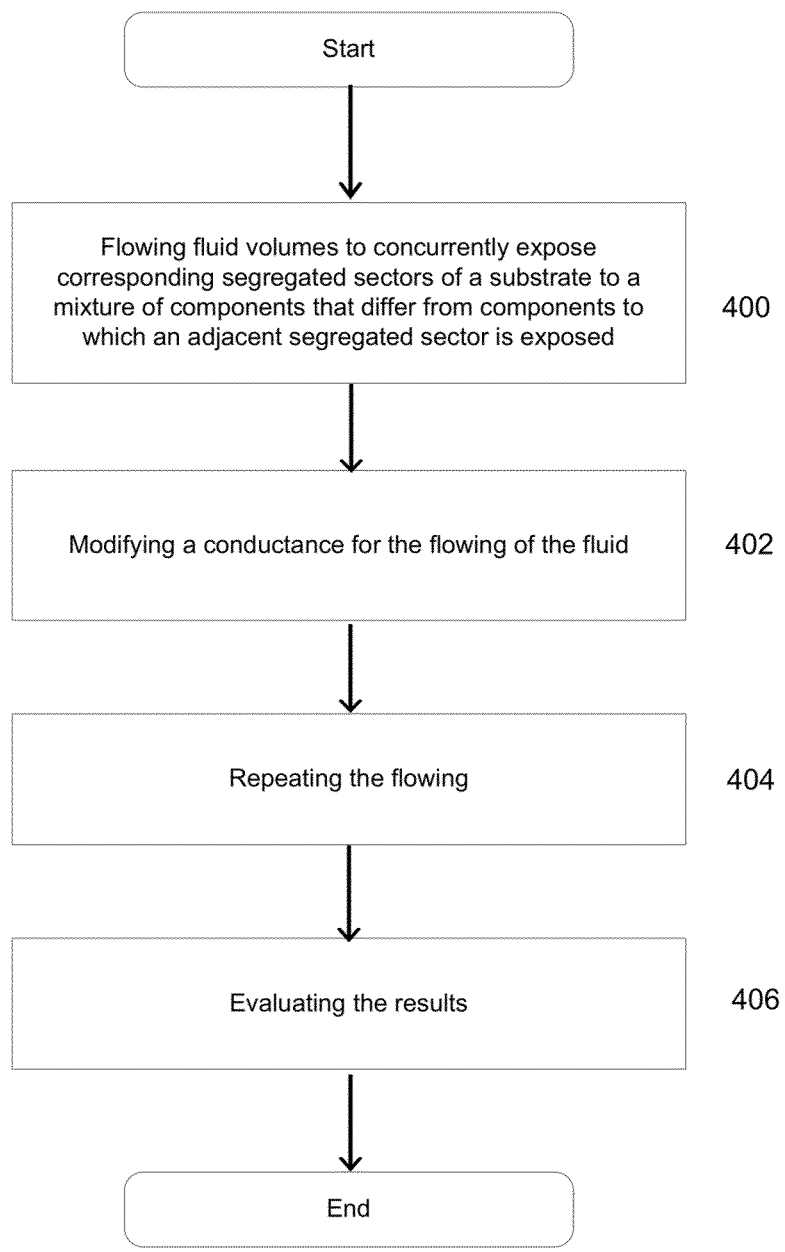
FIG. 7 is a flow chart diagram illustrating the method operations for processing the semiconductor substrate in accordance with one embodiment of the invention.

FIG. 7 is a flow chart diagram illustrating the method operations for processing the semiconductor substrate in accordance with one embodiment of the invention. It should be appreciated that the method may be executed to combinatorially process the semiconductor substrate as described above. The method initiates with operation 400 where fluid volume flows to concurrently expose corresponding segregated sectors of the substrate to a mixture of components that differ from components to which an adjacent segregated sector is exposed. In this operation, various sectors of the substrate may be exposed to different gases in order to process different regions differently. Further details on one embodiment for processing the substrate combinatorially for ALD processing may be found in U.S. application Ser. No. 12/013, 729, which is incorporated herein by reference for all purposes.

The method then advances to operation 402 where a conductance for the flowing of the fluid volume is modified. In one embodiment, the conductance may be modified by rotating a bottom annular ring and mating this bottom annular ring with an extension from a top annular ring as described above with reference to FIGS. 1 through 6. It should be appreciated that the varying of the conductance may be performed in-situ without breaking vacuum in the chamber so that different regions of the substrate are processed differently to evaluate the resulting processes to determine the impact of variation of the conductance. The method then proceeds to operation 404 where the flowing is repeated. In one embodiment, the mixture of components being exposed to a different segregated sector is varied. The method moves to operation 406 where the results of the combinatorial processing performed on the substrate are evaluated. Thus, the embodiments described herein may provide for performing atomic layer deposition differently on different regions of the substrate, wherein one of the process variables which are modified during the processing is the conductance. The conductance is modified via the varying of the conductance gap enabled through the configuration of the top annular ring and the bottom annular ring as described herein.

In summary, the above-described embodiments provide a method and apparatus for controllably varying the conductance for the combinatorial processing of a substrate. Opposing annular rings having a diameter greater than a substrate diameter define a conductance gap between horizontal surfaces so that the conductance gap is not impacted by the thermal processing conditions as compared to a conductance gap defined between vertical surfaces. In one embodiment, the annular rings are composed of an alumina ceramic. However, alternative compositions may be employed, such as aluminum nitride, aluminum, stainless steel, plated ferrous and non-ferrous materials, etc. It should be noted that various alternatives of the conductance ring configuration are possible. For example, while the embodiments provide for a conductance ring having a consistent gap defined around a circumference of the annular rings, this is not meant to be limiting. That is, the conductance ring may have different gaps defined at various sectors along the circumference of the annular rings. For example, where four regions of elevated surfaces are defined, each at about 90 degrees, each of the four regions may define a different conductance gap by varying a level of either one or both of the opposing surfaces of the annular ring. In addition, while the embodiments have been discussed with the top annular ring moving in one planar direction (up or down) and the bottom annular ring moving in two planar directions, this is not meant to be limiting. One skilled in the art will appreciate that the top annular ring may move in two planar directions while the bottom annular ring moves in one or two planar directions in alternative embodiments.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method of processing a semiconductor substrate, comprising:
  identifying two or more sectors of the substrate;
  flowing a plurality of fluids through a segmented channel over the sectors wherein the channel has a conductance;
  modifying the conductance of the channel; and
  repeating the flowing;
  wherein the flowing of a plurality of fluids through the segmented channel exposes each of the sectors to a different fluid;
  wherein the modifying is done by rotating a bottom annular ring and mating this bottom annular ring with an extension from a top annular ring, wherein the mating is accomplished by translating the bottom member in a vertical direction;

wherein the modifying is done in a combinatorial manner.

2. The method of claim 1, wherein the modifying includes, rotating the substrate prior to repeating the flowing.

3. The method of claim 1, further comprising:

repeating the flowing with a different mixture of fluids while varying the conductance.

4. The method of claim 1, wherein the flowing of the fluid volume deposits a layer of material on a surface of the substrate.

5. The method of claim 1, wherein modifying the conductance includes, closing a gap between an upper annular ring and a lower annular ring to enclose the substrate and substantially eliminate flow outside of the upper and lower annular rings.

* * * * *